US011309024B2

(12) United States Patent
Giduturi

(10) Patent No.: US 11,309,024 B2
(45) Date of Patent: Apr. 19, 2022

(54) MEMORY CELL PROGRAMMING THAT CANCELS THRESHOLD VOLTAGE DRIFT

(71) Applicant: Micron Technology, Inc., Boise, ID (US)

(72) Inventor: Hari Giduturi, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/005,739

(22) Filed: Aug. 28, 2020

(65) Prior Publication Data

US 2022/0068383 A1 Mar. 3, 2022

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 2013/0078* (2013.01); *G11C 2213/15* (2013.01); *G11C 2213/73* (2013.01)

(58) Field of Classification Search
CPC .............. G11C 13/0069; G11C 13/003; G11C 13/0078
USPC ........................................................ 365/148
See application file for complete search history.

(56) References Cited

U.S. PATENT DOCUMENTS

| 9,799,381 | B1 * | 10/2017 | Tortorelli | ........... | G11C 13/0069 |
| 2013/0094275 | A1 | 4/2013 | Chen | | |
| 2014/0003130 | A1 * | 1/2014 | Ichihara | ............. | G11C 13/0007 |
| | | | | | 365/148 |
| 2014/0056053 | A1 | 2/2014 | Ramaswamy et al. | | |
| 2017/0047118 | A1 | 2/2017 | Castro | | |
| 2017/0139628 | A1 | 5/2017 | Yoon et al. | | |
| 2017/0221562 | A1 | 8/2017 | Buchanan | | |
| 2019/0043580 | A1 * | 2/2019 | Pirovano | ............ | G11C 13/0004 |
| 2020/0372955 | A1 * | 11/2020 | Chen | ................. | G11C 13/0069 |

FOREIGN PATENT DOCUMENTS

KR 10-2017-0056242 A 5/2017

OTHER PUBLICATIONS

U.S. Appl. No. 16/729,731, entitled, "Three-State Programming of Memory Cells", filed Dec. 30, 2019, 35 pages.
U.S. Appl. No. 16/729,787, entitled, "Multi-State Programming of Memory Cells", filed Dec. 30, 2019, 48 pages.
International Search Report and Written Opinion from related International Patent Application No. PCT/US2021/047071, dated Nov. 29, 2021, 11 pages.

* cited by examiner

*Primary Examiner* — Vu A Le
(74) *Attorney, Agent, or Firm* — Brooks, Cameron & Huebsch, PLLC

(57) ABSTRACT

The present disclosure includes apparatuses, methods, and systems for memory cell programming that cancels threshold voltage drift. An embodiment includes a memory having a plurality of memory cells, and circuitry configured to program a memory cell of the plurality of memory cells to one of two possible data states by applying a first voltage pulse to the memory cell, wherein the first voltage pulse has a first polarity and a first magnitude, and applying a second voltage pulse to the memory cell, wherein the second voltage pulse has a second polarity that is opposite the first polarity and a second magnitude that can be greater than the first magnitude.

22 Claims, 6 Drawing Sheets

MEMORY CELL PROGRAMMING THAT CANCELS THRESHOLD VOLTAGE DRIFT

TECHNICAL FIELD

The present disclosure relates generally to semiconductor memory and methods, and more particularly, to memory cell programming that cancels threshold voltage drift.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage, or sensing voltage through the cell responsive to an applied interrogation current. The sensed current or voltage, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

Figure 1:
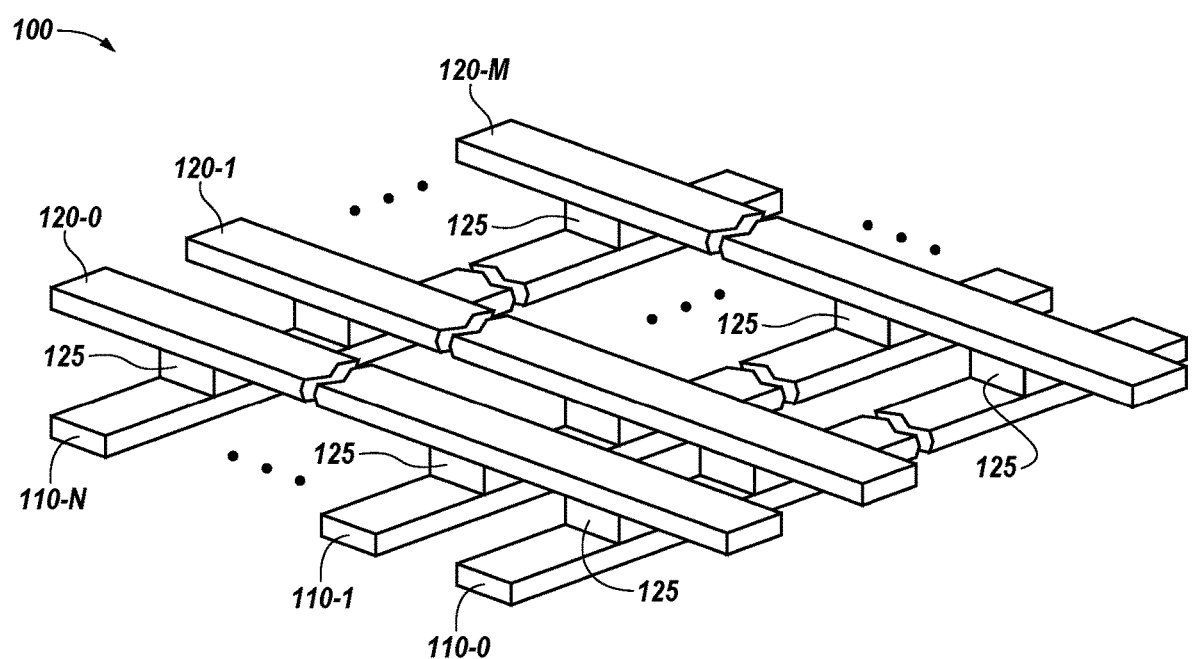
FIG. 1 is a three-dimensional view of an example of a memory array, in accordance with an embodiment of the present disclosure.

The present disclosure includes apparatuses, methods, and systems for memory cell programming that cancels threshold voltage drift. An embodiment includes a memory having a plurality of memory cells, and circuitry configured to program a memory cell of the plurality of memory cells to one of two possible data states by applying a first voltage pulse to the memory cell, wherein the first voltage pulse has a first polarity and a first magnitude, and applying a second voltage pulse to the memory cell, wherein the second voltage pulse has a second polarity that is opposite the first polarity and has a second magnitude that can be greater than the first magnitude.

Embodiments of the present disclosure can provide benefits, such as increased density, reduced cost, increased performance, reduced power consumption, and/or faster and/or more complex operations, as compared to previous memory devices. For example, after resistance variable memory cells, such as self-selecting memory cells, have been programmed, the threshold voltage of the cell may drift (e.g., change) to a higher magnitude value over time. In previous approaches, this threshold voltage drift may result in a higher magnitude voltage pulse being needed to program the memory cell to its target data state during a subsequent program operation, which in turn may increase the amount of power used by the memory device during the program operation.

However, memory cell programming embodiments of the present disclosure can cancel this threshold voltage drift by adjusting (e.g., returning) the threshold voltage of the memory cell to the threshold voltage to which the cell was previously (e.g., initially) programmed, prior to applying the voltage pulse used to program the cell to its target data state. With the threshold voltage drift cancelled, the magnitude of the voltage pulse that is then used to program the cell to its target data state can be lower (e.g., by approximately 0.6 Volts) than the magnitude of the voltage pulse used to program the cell in previous approaches (e.g., if the threshold voltage drift was not cancelled). Accordingly, memory cell programming embodiments of the present disclosure can use less power than previous programming approaches.

Further, during programming of a resistance variable (e.g., self-selecting) memory cell, the cell may be selected by applying a voltage to (e.g., selecting) the two intersecting signal lines (e.g., the intersecting word line and bit line) at which the memory cell is located in the array. However, because of the higher magnitude voltage pulse used in previous programming approaches, the other (e.g., unselected) memory cells that are not being programmed, but are coupled to (e.g., on) these two signal lines, may experience significant leakage while this voltage is being applied to the lines, which may cause these cells to be inadvertently (e.g., falsely) selected during previous programming approaches.

To prevent such a false selection of the unselected memory cells during previous programming approaches, an additional bias voltage (e.g., a C-cell bias voltage) may be applied to the other (e.g., unselected) word lines of the array while the selected cell is being programmed. However, applying this additional bias voltage may further increase the amount of power used by the memory device during the program operation. Further, applying this additional bias voltage may involve (e.g., require) performing a snap back detection on the memory cells (e.g., to identify the word lines to which this additional bias voltage would need to be applied), which may still further increase the amount power used by the memory device during the program operation, as well as increase the complexity of the circuitry used by the memory device during the program operation.

Because, however, memory cell programming embodiments of the present disclosure can cancel the threshold voltage drift, and therefore use a lower magnitude voltage pulse to program the selected memory cell to its target data state than previous approaches, there may be no need to prevent a false selection of unselected memory cells during programming embodiments of the present disclosure. Therefore, there may be no need to apply any additional bias voltage to the unselected word lines of the array, and no need to perform a snap back detection (e.g., no need for snap back detection circuitry), during programming embodiments of the present disclosure. Eliminating the additional bias voltage and snap back detection may further reduce the amount of power used by programming embodiments of the present disclosure as compared with previous approaches, and may reduce the complexity of the circuitry used by programming embodiments of the present disclosure as compared with previous approaches.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality second signal lines (e.g., second access lines), which may be referred to as bit lines 120-0 to 120-M) that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different data states. In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. In some examples, each memory cell 125 may include a ternary composition that may include selenium (Se), arsenic (As), and germanium (Ge), a quaternary composition that may include silicon (Si), Se, As, and Ge, etc.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

Embodiments of the present disclosure are not limited to the example memory array architecture illustrated in FIG. 1. For example, embodiments of the present disclosure can include a three-dimensional memory array having a plurality of vertically oriented (e.g., vertical) access lines and a plurality of horizontally oriented (e.g., horizontal) access lines. The vertical access lines can be bit lines arranged in a pillar-like architecture, and the horizontal access lines can be word lines arranged in a plurality of conductive planes or decks separated (e.g., insulated) from each other by a dielectric material. The chalcogenide material of the respective memory cells of such a memory array can be located at the crossing of a respective vertical bit line and horizontal word line.

Figure 2A:
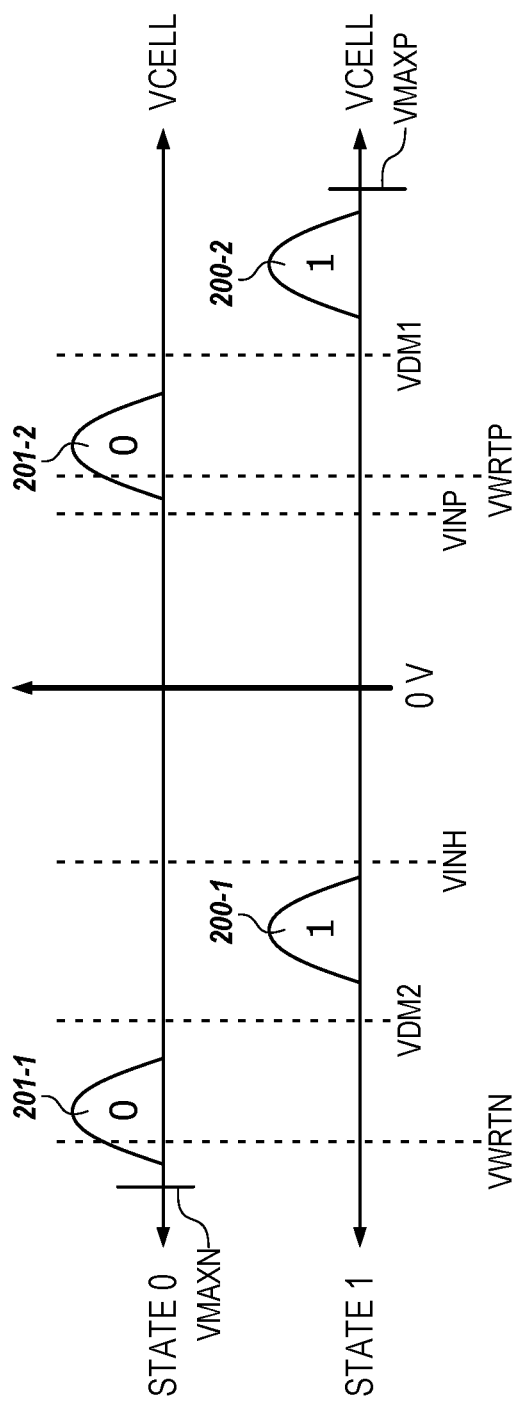
FIG. 2A illustrates threshold voltage distributions associated with memory states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of two possible data states (e.g., state 0 or state 1). That is, FIG. 2A illustrates threshold voltage distributions associated with two possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 200-1, 200-2, 201-1, and 201-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
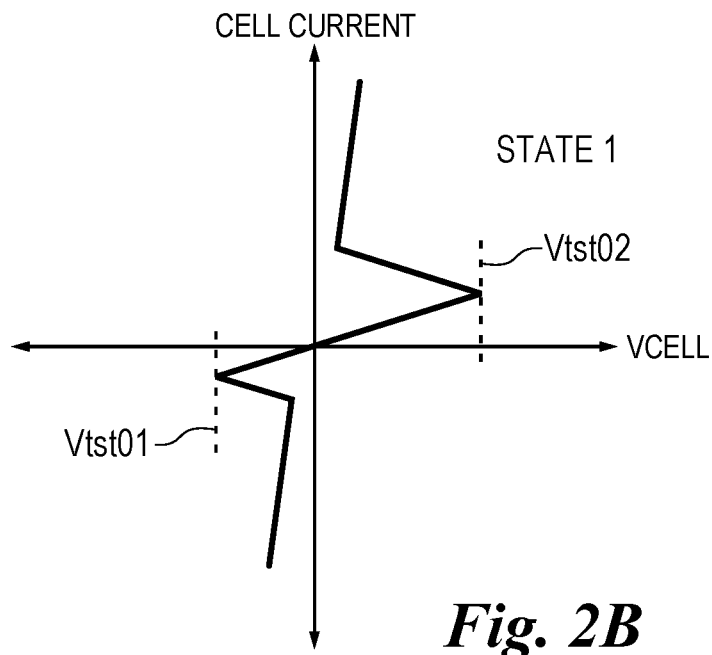
FIG. 2B is an example of a current-versus-voltage curve corresponding to a memory state of FIG. 2A, in accordance with an embodiment of the present disclosure.
Figure 2C:
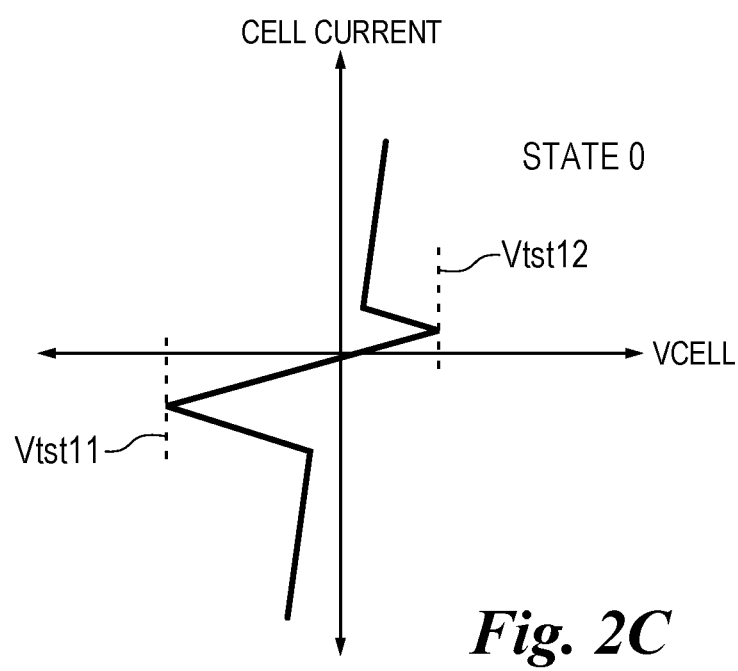
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to a reset state (e.g., state 0) or a set state (e.g., state 1) may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 201-1 and 201-2) whose magnitude is greater for a negative polarity than a positive polarity, and a second data state (e.g., state 1) is associated with a second asymmetric threshold voltage distribution (e.g., threshold voltage distributions 200-1 and 200-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 201-2) from cells in state 1 (e.g., threshold voltage distribution 200-2). Similarly, VDM2 is a negative voltage used to distinguish cells in state 1 (e.g., threshold voltage distribution 200-1) from cells in state 0 (e.g., threshold voltage distribution 201-1). In the examples of FIGS. 2A-2C, a memory cell 125 in a positive state 1 does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 does not snap back in response to applying VDM2.

FIG. 2A also illustrates voltages VMAXN, VMAXP, VWRTN, VWRTP, VINH, and VINP. One or more of these voltages can be used in an operation to program a memory cell to state 0 or state 1, as will be further described herein.

Embodiments are not limited to the example shown in FIG. 2A. For example, the designations of state 0 and state 1 can be interchanged (e.g., distributions 201-1 and 201-2 can be designated as state 1 and distributions 200-1 and 200-2 can be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective bit line and word line). As shown in FIG. 2B, responsive to an applied positive polarity voltage (VCELL), a memory cell programmed to state 1 (e.g., threshold voltage distribution 200-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 200-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event can be used to write a cell to the opposite state (e.g., from state 1 to state 0 and vice versa), along with applying a current of a particular magnitude for a particular duration after the snapback event.

In an embodiment of the present disclosure, a memory cell, such as memory cells 125 illustrated in FIG. 1, can be programmed to one of two possible data states (e.g., state 0 or state 1). For example, the memory cell can be programmed by applying a first voltage pulse to the memory cell, and then subsequently applying a second voltage pulse to the memory cell after the first voltage pulse is applied. The first voltage pulse can have a first polarity that is opposite the polarity direction of the one of the two possible data states to which the cell is being programmed, and the second voltage pulse can have a second polarity that is opposite the first polarity (e.g., the second polarity is the polarity direction of the data state to which the cell is being programmed). Further, the first voltage pulse can have a first magnitude, and the second voltage pulse can have a second magnitude that can be greater than the first magnitude.

Further, after the first voltage pulse is applied to the memory cell, but before the second voltage pulse is applied to the memory cell, the current to the memory cell can be turned off (e.g., inhibited). A current pulse can then be applied to the memory cell while the second voltage pulse is being applied to the memory cell.

As an example, to program the memory cell to a set data state (e.g., state 1) the polarity of the first voltage pulse may be positive, and the polarity of the second voltage pulse and the current pulse may be negative. As an additional example, to program the memory cell to a reset data state (e.g., state 0), the polarity of the first voltage pulse may be negative, and the polarity of the second voltage pulse and the current pulse may be positive. In some examples, the memory cell can be programmed to the reset data state without applying the first (e.g., negative) voltage pulse (e.g., in such examples, the cell can be programmed to the reset data state by applying only the second voltage pulse and the current pulse). Examples illustrating such voltage and current pulses will be further described herein (e.g., in connection with FIGS. 3A-3B).

The magnitude of the first voltage pulse (e.g., the first magnitude) can be, for example, the same magnitude as a voltage used to distinguish memory cells 125 programmed to the one of the two possible data states from memory cells 125 programmed to the other one of the two possible data states. For instance, the magnitude of the first voltage pulse can be the same as the magnitude of demarcation voltages VDM1 and/or VDM2 illustrated in FIG. 2A. As an additional example, in examples in which the memory cell is being programmed to the set data state, the magnitude of the first voltage pulse can be less than the magnitude of a voltage used to distinguish memory cells 125 programmed to the one of the two possible data states from memory cells 125 programmed to the other one of the two possible data states. For instance, in such examples, the magnitude of the first voltage pulse can be the magnitude of VWRTP illustrated in FIG. 2A. The magnitude of VWRTP can be given by, for instance:

$$VWRTP=VMAXN-VWRTN+VINH+VOSP$$

where VMAXN, VWRTN, and VINH are the magnitudes of VMAXN, VWRTN, and VINH, respectively, illustrated in FIG. 2A, and VOSP is the magnitude of an offset voltage due to the change in polarity from first voltage pulse to the second voltage pulse.

The magnitude of the second voltage pulse (e.g., the second magnitude) can be, for example, the maximum voltage magnitude used to program memory cells 125 to the one of the two possible data states. For instance, in examples in which the memory cell is being programmed to the set data state, the magnitude of the second voltage pulse can be the magnitude of VMAXN illustrated in FIG. 2A, and in examples in which the memory cell is being programmed to the reset data state, the magnitude of the second voltage pulse can be the magnitude of VMAXP illustrated in FIG. 2A. The magnitude of VMAXP can be given by, for instance:

$$VMAXP=VMAXN+VOSP$$

The magnitude of the second voltage pulse (e.g., the magnitudes of VMAXN and VMAXP) can be lower (e.g., by approximately 0.6 Volts) than the maximum voltage magnitude used to program memory cells in previous programming approaches.

For example, applying the first voltage pulse to the memory cell can adjust (e.g., return) the threshold voltage of the cell to the threshold voltage to which the cell was previously (e.g., initially) programmed. Accordingly, any threshold voltage drift (e.g., change) that may have occurred in the memory cell can be cancelled by applying the first voltage pulse to the memory cell. Because the threshold voltage drift can be cancelled in such a manner, the magnitude of the second voltage pulse applied to the cell can be lower than maximum voltage magnitude used in previous programming approaches.

Further, because the magnitude of the second voltage pulse applied to the memory cell can be lower than the maximum voltage magnitude of previous programming approaches, the other (e.g., unselected) memory cells that are coupled to the same signal lines (e.g., the same word line 110 and/or bit line 120) as the memory cell may not experience any leakage while the second voltage is being applied to the memory cell (e.g., to the signal lines coupled to the memory cell), and therefore may not be susceptible to being inadvertently (e.g., falsely) selected during the programming of the memory cell. Accordingly, the memory cell can be programmed without having to apply an additional bias voltage (e.g., a C-cell bias voltage) to the other (e.g., unselected) access lines (e.g., the unselected word lines 110) to prevent the unselected memory cells from being inadvertently selected while the selected memory cell is being programmed.

Further, because the memory cell can be programmed without having to apply the additional bias voltage to the unselected access lines, there may be no need to perform a snap back detection during programming of the memory cell. For instance, the memory cell can be programmed without determining whether the memory cell snaps back in response to either the first applied voltage or the second applied voltage. Accordingly, the memory cell can be programmed without utilizing snap back detection circuitry.

Figure 3A:
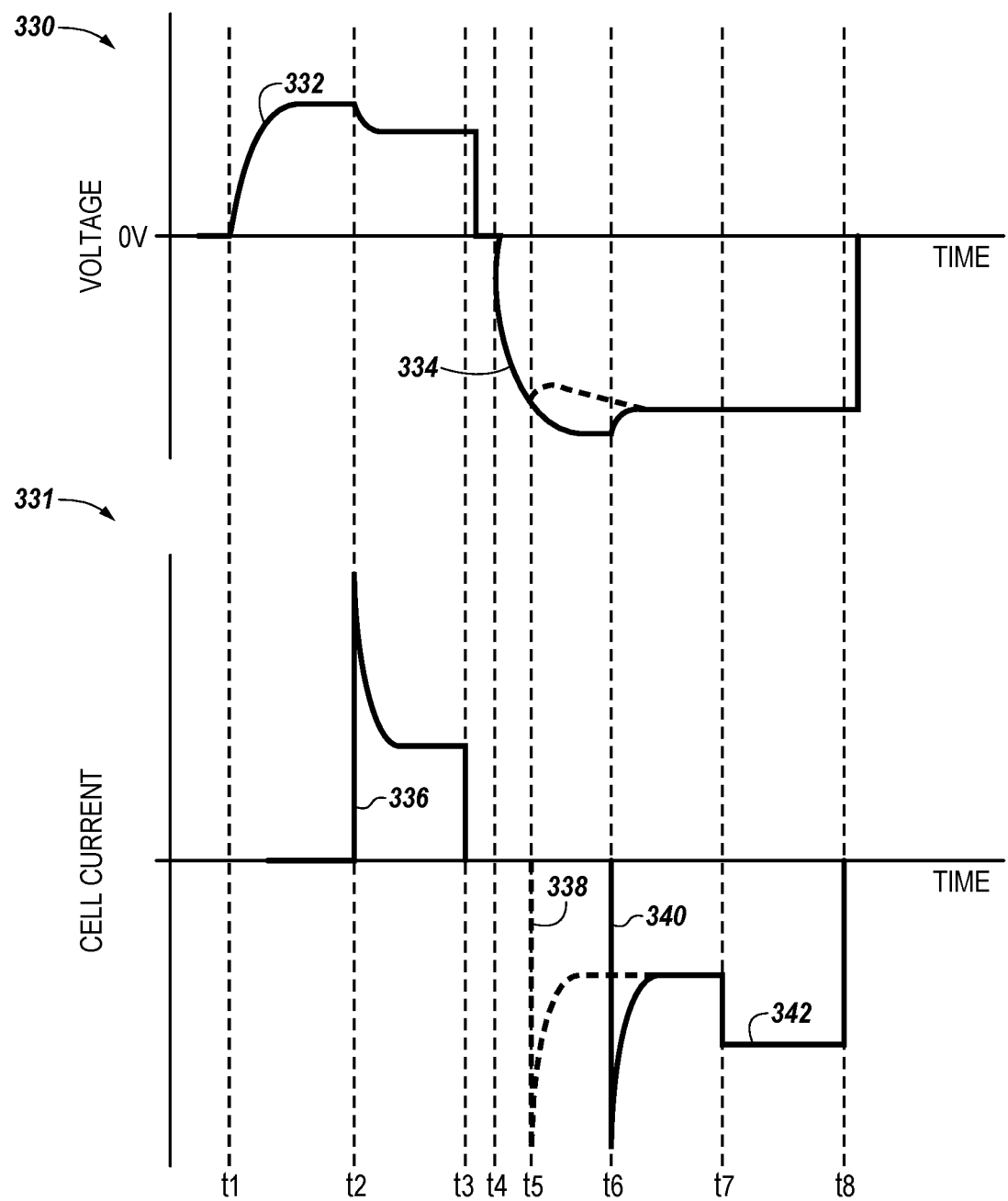
FIG. 3A illustrates an example of voltage pulses applied to a memory cell, and an example of current flow through the memory cell, in accordance with an embodiment of the present disclosure.

FIG. 3A illustrates an example, in the form of graph 330, of voltage pulses applied to a memory cell, and an example, in the form of graph 331 of current flow through the memory cell, in accordance with an embodiment of the present disclosure. For example, graph 330 can illustrate the voltage pulses applied to a memory cell, and graph 331 can illustrate the current flow through the memory cell, during an operation to program the memory to a set data state in accordance with the present disclosure. The memory cell can be, for example, memory cell 125 previously described in connection with FIG. 1.

At time t1 shown in FIG. 3A, voltage pulse 332 is applied to the memory cell. Voltage pulse 332 is a positive voltage pulse, as illustrated in FIG. 3A, and can have a magnitude of VDM1 or VWRTP illustrated in FIG. 2A, as previously described herein.

Applying voltage pulse 332 to the memory cell can cancel a threshold voltage drift that may have occurred in the memory cell if the cell was previously programmed to a reset data state. For example, applying voltage pulse 332 to a memory cell that was previously programmed to a reset data state and has a threshold voltage that has drifted from the high magnitude reset threshold voltage distribution (e.g., distribution 201-1 illustrated in FIG. 2A) can cause a snapback event to occur in the memory cell at time t2 illustrated in FIG. 3A, such that the threshold voltage of the memory cell appears within the low magnitude reset threshold voltage distribution (e.g., 201-2 illustrated in FIG. 2A). When the snap back event occurs at time t2, a positive pulse 336 of current flows through the memory cell, as illustrated in FIG. 3A. The current flow through the cell then dissipates after time t2, as illustrated in FIG. 3A.

At time t3 shown in FIG. 3A, the voltage and current to the memory cell are turned off. For instance, voltage pulse 332 ends at time t3, and no current flows through the memory cell at time t3.

At time t4 shown in FIG. 3A, voltage pulse 334 is applied to the memory cell. Voltage pulse 334 is a negative voltage pulse, as illustrated in FIG. 3A, and can have a magnitude of VMAXN illustrated in FIG. 2A, as previously described herein.

Applying voltage pulse 334 to a memory cell that was previously programmed to a set data state may cause a negative pulse 338 of current to flow through the memory cell at time t5 illustrated in FIG. 3A, a snap back event may occur in the memory cell, and the threshold voltage of the cell may remain within the low magnitude set threshold voltage distribution (e.g., distribution 200-1 illustrated in FIG. 2A). The current flow through the cell then dissipates after time t5, as illustrated in FIG. 3A.

However, applying voltage pulse 334 to a memory cell that was previously programmed to a reset data state can cause a snapback event (e.g. a re-snap) to occur in the memory cell at time t6 illustrated in FIG. 3A, such that the threshold voltage of the memory cell appears within the high magnitude reset threshold voltage distribution (e.g., 201-1 illustrated in FIG. 2A). When the snap back event occurs at time t6, a negative pulse 340 of current flows through the memory cell, as illustrated in FIG. 3A. The current flow through the cell then dissipates after time t6, as illustrated in FIG. 3A.

At time t7 shown in FIG. 3A, a negative (e.g., set) current pulse 342 is applied to the memory cell. Applying current pulse 342 to a memory cell that was previously programmed to a reset data state can cause the cell to switch to a set data state, and applying current pulse 342 to a memory cell that was previously programmed to a set data state can refresh the set data state of the cell.

At time t8 shown in FIG. 3A, the operation to program the memory cell to the set data state is complete, and the voltage and current to the memory cell are turned off. For instance, voltage pulse 334 ends at time t8, and no current flows through the memory cell at time t8.

Figure 3B:
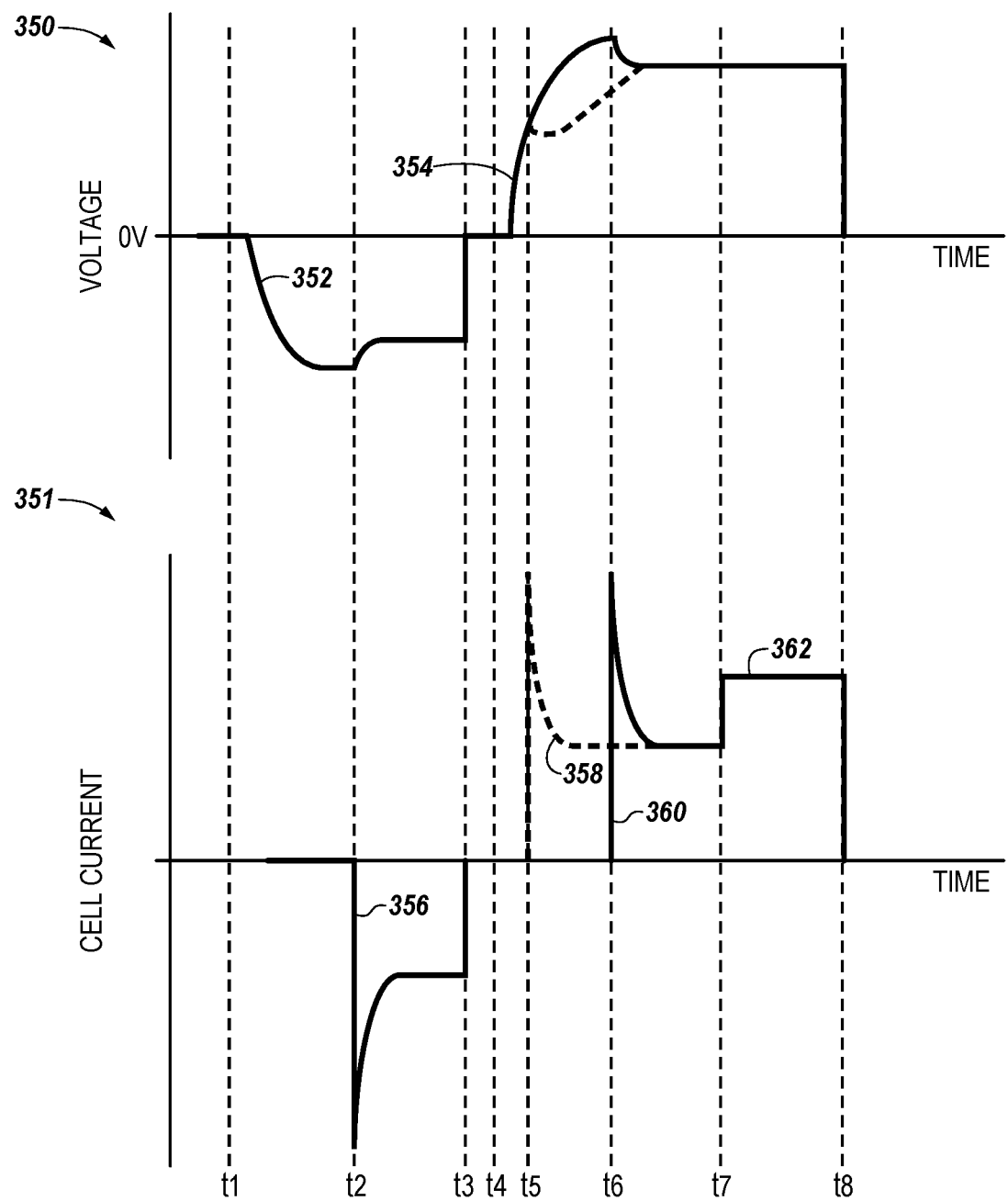
FIG. 3B illustrates an additional example of voltage pulses applied to a memory cell, and an additional example of current flow through the cell, in accordance with an embodiment of the present disclosure.

FIG. 3B illustrates an additional example, in the form of graph 350, of voltage pulses applied to a memory cell, and an additional example, in the form of graph 351 of current flow through the memory cell, in accordance with an embodiment of the present disclosure. For example, graph 350 can illustrate the voltage pulses applied to a memory cell, and graph 351 can illustrate the current flow through the memory cell, during an operation to program the memory to a reset data state in accordance with the present disclosure. The memory cell can be, for example, memory cell 125 previously described in connection with FIG. 1.

At time t1 shown in FIG. 3B, voltage pulse 352 is applied to the memory cell. Voltage pulse 352 is a negative voltage pulse, as illustrated in FIG. 3A, and can have a magnitude of VDM2 illustrated in FIG. 2A, as previously described herein. In some examples, however, it may not be necessary to apply voltage pulse 352 to the memory cell to program the cell to the reset data state, as previously described herein.

Applying voltage pulse 352 to the memory cell can cancel a threshold voltage drift that may have occurred in the memory cell if the cell was previously programmed to a set data state. For example, applying voltage pulse 352 to a memory cell that was previously programmed to a set data state and has a threshold voltage that has drifted (e.g., distribution 200-1 illustrated in FIG. 2A) can cause a snapback event to occur in the memory cell at time t2 illustrated in FIG. 3B, such that the threshold voltage of the memory cell appears within the low magnitude set threshold voltage distribution (e.g., 200-1 illustrated in FIG. 2A). When the snap back event occurs at time t2, a negative pulse 356 of current flows through the memory cell, as illustrated in FIG. 3B. The current flow through the cell then dissipates after time t2, as illustrated in FIG. 3B.

At time t3 shown in FIG. 3B, the voltage and current to the memory cell are turned off. For instance, voltage pulse 352 ends at time t3, and no current flows through the memory cell at time t3.

At time t4 shown in FIG. 3B, voltage pulse 354 is applied to the memory cell. Voltage pulse 354 is a positive voltage pulse, as illustrated in FIG. 3B, and can have a magnitude of VMAXP illustrated in FIG. 2A, as previously described herein.

Applying voltage pulse 354 to a memory cell that was previously programmed to a reset data state can cause a snapback event to occur in the memory cell at time t5 illustrated in FIG. 3B, such that the threshold voltage of the memory cell appears within the low magnitude reset threshold voltage distribution (e.g., 201-2 illustrated in FIG. 2A). When the snapback event occurs at time t5, a positive pulse 358 of current flows through the memory cell, as illustrated in FIG. 3B. The current flow through the cell then dissipates after time t5, as illustrated in FIG. 3B.

Further, applying voltage pulse 354 to a memory cell that was previously programmed to a set data state can cause a snapback event (e.g. a re-snap) to occur in the memory cell at time t6 illustrated in FIG. 3B, such that the threshold voltage of the memory cell appears within the high magnitude set threshold voltage distribution (e.g., 200-2 illustrated in FIG. 2A). When the snap back event occurs at time t6, a positive pulse 360 of current flows through the memory cell, as illustrated in FIG. 3B. The current flow through the cell then dissipates after time t6, as illustrated in FIG. 3B.

At time t7 shown in FIG. 3B, a positive (e.g., reset) current pulse 362 is applied to the memory cell. Applying current pulse 362 to a memory cell that was previously programmed to a set data state can cause the cell to switch to a reset data state, and applying current pulse 342 to a memory cell that was previously programmed to a reset data state can refresh the reset data state of the cell.

At time t8 shown in FIG. 3B, the operation to program the memory cell to the reset data state is complete, and the voltage and current to the memory cell are turned off. For instance, voltage pulse 354 ends at time t8, and no current flows through the memory cell at time t8.

It should be noted that the polarities of the voltage pulses and current flows illustrated in FIGS. 3A and 3B can correspond to a particular (e.g., negative) polarity of the current used to sense (e.g., read) the data state of the memory cell. If an opposite (e.g., positive) polarity current is used to sense the data state of the memory cell, the polarities of the voltage pulses and current flows can be flipped to achieve the same net programming effect.

Figure 4:
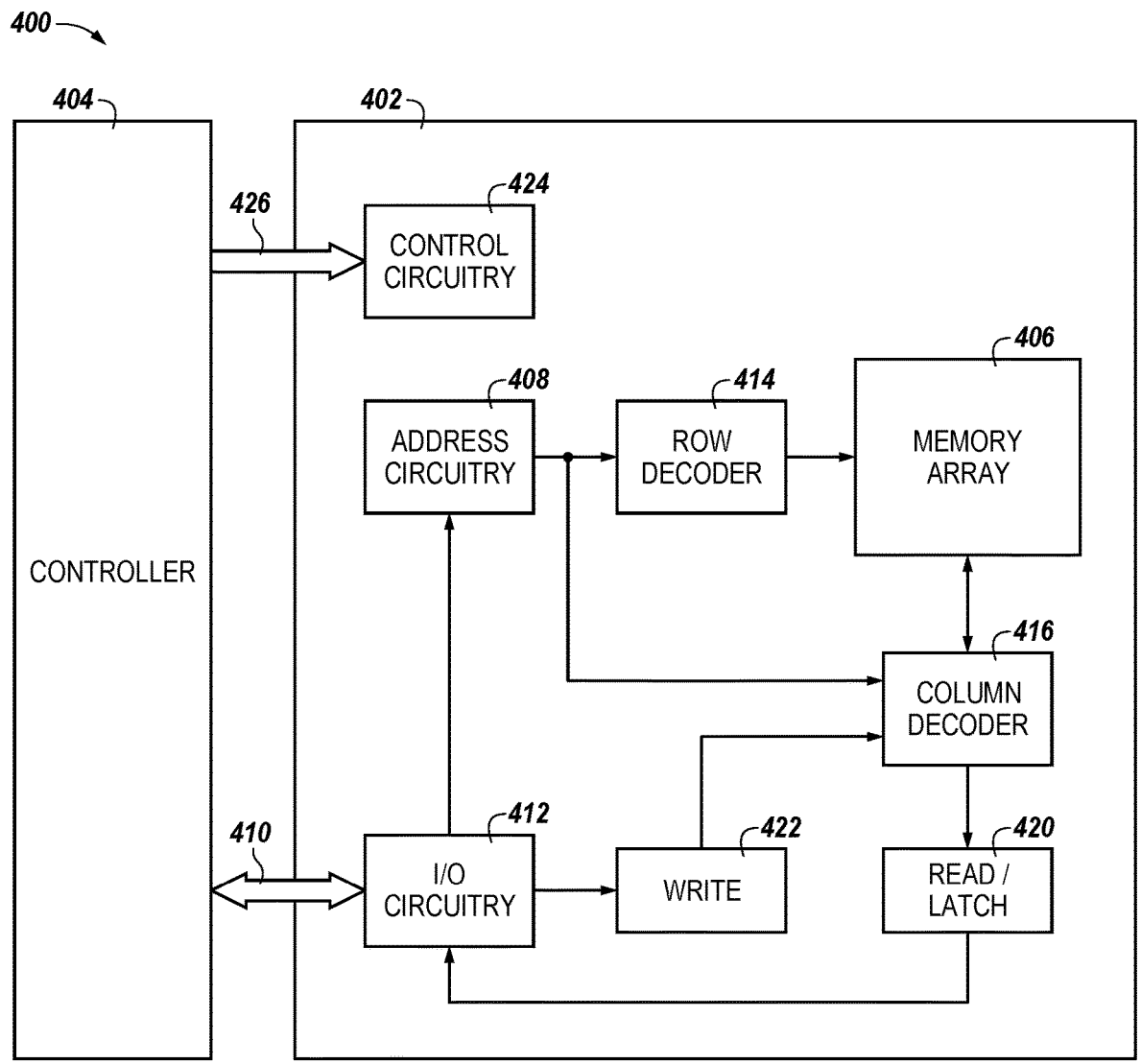
FIG. 4 is a block diagram illustration of an example apparatus, in accordance with an embodiment of the present disclosure.

FIG. 4 is a block diagram illustration of an example apparatus, such as an electronic memory system 400, in accordance with an embodiment of the present disclosure. Memory system 400 includes an apparatus, such as a memory device 402, and a controller 404, such as a memory controller (e.g., a host controller). Controller 404 might include a processor, for example. Controller 404 might be coupled to a host, for example, and may receive command signals (or commands), address signals (or addresses), and data signals (or data) from the host and may output data to the host.

Memory device 402 includes a memory array 406 of memory cells. For example, memory array 406 may include one or more of the memory arrays, such as a cross-point array, of memory cells disclosed herein.

Memory device 402 includes address circuitry 408 to latch address signals provided over I/O connections 410 through I/O circuitry 412. Address signals are received and decoded by a row decoder 414 and a column decoder 416 to access the memory array 406. For example, row decoder 414 and/or column decoder 416 may include drivers.

Memory device 402 may sense (e.g., read) data in memory array 406 by sensing voltage and/or current changes in the memory array columns using sense/buffer circuitry that in some examples may be read/latch circuitry 420. Read/latch circuitry 420 may read and latch data from the memory array 406. I/O circuitry 412 is included for bi-directional data communication over the I/O connections 410 with controller 404. Write circuitry 422 is included to write data to memory array 406.

Control circuitry 424 may decode signals provided by control connections 426 from controller 404. These signals may include chip signals, write enable signals, and address latch signals that are used to control the operations on memory array 406, including data read and data write operations.

Control circuitry 424 may be included in controller 404, for example. Controller 404 may include other circuitry, firmware, software, or the like, whether alone or in combination. Controller 404 may be an external controller (e.g., in a separate die from the memory array 406, whether wholly or in part) or an internal controller (e.g., included in a same die as the memory array 406). For example, an internal controller might be a state machine or a memory sequencer. In some examples, controller 404 may be configured to cause memory device 402 to at least perform the methods disclosed herein, such as programming the memory cells of array 406 to one of two possible data states.

As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

It will be appreciated by those skilled in the art that additional circuitry and signals can be provided, and that the memory system 400 of FIG. 4 has been simplified. It should be recognized that the functionality of the various block components described with reference to FIG. 4 may not necessarily be segregated to distinct components or component portions of an integrated circuit device. For example, a single component or component portion of an integrated circuit device could be adapted to perform the functionality of more than one block component of FIG. 4. Alternatively, one or more components or component portions of an integrated circuit device could be combined to perform the functionality of a single block component of FIG. 4.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory having a plurality of memory cells; and
circuitry configured to program a memory cell of the plurality of memory cells to one of two possible data states by:
applying a first voltage pulse to the memory cell, wherein the first voltage pulse has a first polarity and a first magnitude; and
applying a second voltage pulse to the memory cell, wherein the second voltage pulse has a second polarity that is opposite the first polarity and a second magnitude;
wherein the circuitry is configured to program the memory cell to the one of the two possible data states without determining whether the memory cell snaps back in response to either the first applied voltage pulse or the second applied voltage pulse.

2. The apparatus of claim 1, wherein the first polarity is opposite a polarity direction of the one of the two possible data states to which the memory cell is being programmed.

3. The apparatus of claim 1, wherein each of the plurality of memory cells is a self-selecting memory cell in which a single material serves as a select element and a storage element.

4. The apparatus of claim 3, wherein the single material is a chalcogenide material.

5. The apparatus of claim 1, wherein:
the memory includes a plurality of access lines coupled to the plurality of memory cells;
the memory cell being programmed is coupled to one of the plurality of access lines; and
the circuitry is configured to program the memory cell to the one of the two possible data states without applying a voltage to the plurality of access lines to which the memory cell being programmed is not coupled.

6. The apparatus of claim 1, wherein the circuitry is configured to program the memory cell to the one of the two possible data states by turning off a current to the memory cell after applying the first voltage pulse to the memory cell and before applying the second voltage pulse to the memory cell.

7. The apparatus of claim 1, wherein the second magnitude is greater than the first magnitude.

8. A method of operating memory, comprising:
programming a memory cell to one of two possible data states by:

applying a first voltage pulse to the memory cell, wherein the first voltage pulse has a first polarity and a first magnitude;

applying a second voltage pulse to the memory cell, wherein:

the second voltage pulse has a second polarity that is opposite the first polarity and is a polarity direction of the one of the two possible data states to which the memory cell is being programmed; and the second voltage pulse has a second magnitude; and applying a current pulse to the memory cell while the second voltage pulse is being applied to the memory cell.

9. The method of claim 8, wherein the first polarity is a positive polarity.

10. The method of claim 8, wherein the first polarity is a negative polarity.

11. The method of claim 8, wherein applying the first voltage pulse to the memory cell adjusts a threshold voltage of the memory cell to a threshold voltage to which the memory cell was previously programmed.

12. The method of claim 8, wherein the current pulse has a negative polarity.

13. The method of claim 8, wherein the current pulse has a positive polarity.

14. An apparatus, comprising:

a memory having a plurality of memory cells; and circuitry configured to program a memory cell of the plurality of memory cells to one of two possible data states by:

applying a first voltage pulse to the memory cell, wherein the first voltage pulse has a positive polarity and a first magnitude, wherein the first magnitude is a same magnitude as a voltage used to distinguish memory cells of the plurality of memory cells programmed to the one of the two possible data states from memory cells of the plurality of memory cells programmed to the other one of the two possible data states; and applying a second voltage pulse to the memory cell, wherein the second voltage pulse has a negative polarity and a second magnitude.

15. The apparatus of claim 14, wherein the one of the two possible data states is a set data state.

16. The apparatus of claim 14, wherein the second magnitude is a maximum voltage magnitude used to program memory cells of the plurality of memory cells to the one of the two possible data states.

17. A method of operating memory, comprising:

programming a self-selecting memory cell to one of two possible data states by applying a voltage pulse to the self-selecting memory cell, wherein:

the voltage pulse has a positive polarity and a magnitude that is less than a magnitude of a voltage used to distinguish self-selecting memory cells of the memory programmed to the one of the two possible data states from self-selecting memory cells of the memory programmed to the other one of the two possible data states; and the method comprises programming the self-selecting memory cell without determining whether the self-selecting memory cell snaps back in response to the applied voltage pulse.

18. The method of claim 17, wherein the one of the two possible data states is a reset data state.

19. The method of claim 17, wherein the method includes programming the self-selecting memory cell to the one of the two possible data states by applying an additional voltage pulse to the self-selecting memory cell before applying the voltage pulse to the self-selecting memory cell, wherein the additional voltage pulse has a negative polarity.

20. The method of claim 19, wherein the additional voltage pulse has a same magnitude as the voltage used to distinguish self-selecting memory cells of the memory programmed to the one of the two possible data states from self-selecting memory cells of the memory programmed to the other one of the two possible data states.

21. The method of claim 17, wherein the voltage pulse has a magnitude that is a maximum voltage magnitude used to program self-selecting memory cells of the memory to the one of the two possible data states.

22. An apparatus, comprising:

a memory having a plurality of memory cells; and circuitry configured to program a memory cell of the plurality of memory cells to one of two possible data states by:

applying a first voltage pulse to the memory cell, wherein the first voltage pulse has a negative polarity and a first magnitude; and applying a second voltage pulse to the memory cell, wherein the second voltage pulse has a positive polarity and a second magnitude;

wherein:

the memory includes a plurality of access lines coupled to the plurality of memory cells;

the memory cell being programmed is coupled to one of the plurality of access lines; and the circuitry is configured to program the memory cell to the one of the two possible data states without applying a voltage to the plurality of access lines to which the memory cell being programmed is not coupled.

* * * * *